US005156705A

United States Patent [19]

Kane et al.

[11] Patent Number: 5,156,705

[45] Date of Patent: Oct. 20, 1992

[54] NON-HOMOGENEOUS MULTI-ELEMENTAL ELECTRON EMITTER

[75] Inventors: Robert C. Kane, Woodstock, Ill.; Barbara Vasquez, Chandler, Ariz.

[73] Assignee: Motorola, Inc., Schaumburg, Ill.

[21] Appl. No.: 580,047

[22] Filed: Sep. 10, 1990

[51] Int. Cl.[5] .............................................. H01L 21/00

[52] U.S. Cl. .................................... 156/656; 156/654; 156/655; 156/643

[58] Field of Search ............... 156/643, 646, 654, 655, 156/656, 657; 204/192.32; 437/225; 445/24, 49, 29; 313/346 DC, 346 R, 309, 336, 351

[56] References Cited

U.S. PATENT DOCUMENTS

| | | | |
|---|---|---|---|
| 3,656,020 | 3/1972 | Cronin | 313/346 DC |
| 3,812,559 | 5/1974 | Spindt et al. | 445/50 |
| 3,998,678 | 12/1976 | Fukase et al. | 445/24 |
| 4,417,173 | 11/1983 | Tuck et al. | 313/346 DC |
| 4,498,952 | 2/1985 | Christensen | 156/655 |
| 4,518,890 | 5/1985 | Taguchi et al. | 313/346 DC |
| 5,007,873 | 4/1991 | Goronkin et al. | 437/80 |

OTHER PUBLICATIONS

"Deposition Technologies For Films and Coatings"; by Bunshah et al.; ©1982; Noyes Publications, pp. 230-233.

*Primary Examiner*—David A. Simmons
*Assistant Examiner*—George Goudreau
*Attorney, Agent, or Firm*—Eugene A. Parsons

[57] ABSTRACT

A method for forming an electron emitter layer wherein the electron emitter layer comprises a plurality of elemental conductive materials that etch at dis-similar rates to provide a structure with an edge exhibiting a geometric discontinuity of small radius of curvature.

6 Claims, 2 Drawing Sheets

NON-HOMOGENEOUS MULTI-ELEMENTAL ELECTRON EMITTER

TECHNICAL FIELD

This invention relates generally to electron emitters and more particularly to a method of forming an electron emitter.

BACKGROUND OF THE INVENTION

Electron emitters, or field emitters, generally refer to structures that emit electrons when placed within an appropriate electric field. Typically, prior art electron emitters are formed by depositing layers, or laminates, of a homogeneous conductive material on an insulating material. The deposition of layers onto the insulating material may be done using any of the commonly known methods such as vapor deposition or sputtering of the conductive material. Once the electron emitter is formed, it functions by emitting electrons along an edge that has a geometric discontinuity of small radius of curvature.

When electron emitters are formed by depositing layers of conductive material onto the insulating material, they inherently have several undesirable features. For example, in order to achieve a sharp edge feature of a radius of curvature of a few hundreds of angstroms, the electron emitter layers must be very thin (typically less than 500 angstroms). Due to the thinness of the layers, electron emitters are fragile and must be adequately supported. In addition to being adequately supported, the electron emitters must be exposed to a relatively high electric field which requires a relatively high voltage to generate, for example at least 50 volts.

Accordingly, there exists a need for an electron emitter layer that substantially overcomes these problems.

SUMMARY OF THE INVENTION

These needs and others are substantially met through provision of the electron emitter layer formation methodology disclosed herein. Pursuant to this invention, an electron emitter layer may be formed by depositing a non-homogeneous multi-elemental conductive emitter layer onto an insulating support layer. Once the non-homogeneous multi-elemental conductive emitter layer is deposited onto the insulating support layer, the non-homogeneous multi-elemental conductive emitter layer is preferentially etched. The non-homogeneous multi-elemental conductive emitter layer comprises a plurality of elemental conductive materials which, when performing the preferential etching, at least some of the plurality of elemental conductive materials etch at dis-similar rates.

In one embodiment of the present invention, a plurality of dis-similar materials are substantially simultaneously deposited onto a supporting insulating layer to yield a non-homogeneous multi-elemental conductive emitter layer, which layer is subsequently preferentially etched to provide the desired reduction in the radius of curvature of an edge of the aggregate layer.

In another embodiment of the present invention a plurality of dis-similar materials are substantially sequentially deposited onto a supporting insulating layer to yield a non-homogeneous multi-elemental conductive emitter layer, which layer is subsequently preferentially etched to provide the desired reduction in the radius of curvature of an edge of the aggregate layer.

BEST MODE FOR CARRYING OUT THE INVENTION

Figure 1A:
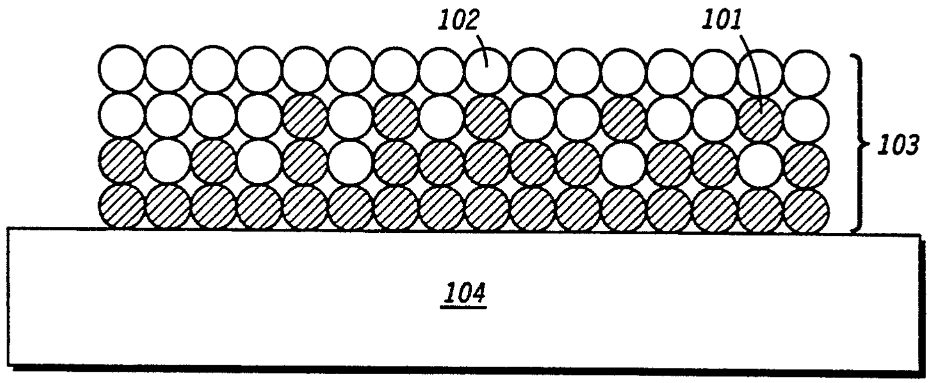
FIGS. 1A–C each illustrate a partial side elevational cross-sectional view of an electron emitter having a non-homogeneous multi-elemental conductive emitter layer in accordance with the present invention.

FIG. 1A shows a non-homogeneous multi-elemental conductive emitter layer (103) deposited on an insulating support layer (104). The non-homogeneous multi-elemental conductive emitter layer (103) comprises a plurality of elemental conductive materials such as metals or silicides, where at least some of the plurality of elemental conductive materials etch at dis-similar rates. The best mode contemplates that the non-homogeneous multi-elemental conductive emitter layer (103) will comprise at least a first elemental conductive material (101) and a second elemental conductive material (102). The non-homogeneous multi-elemental conductive emitter layer (103) may be deposited on the insulating support layer (104) by any of the known deposition methods so long as the first elemental conductive material (101) and the second conductive material (102) are substantially simultaneously deposited onto the insulating support layer (104).

Figure 1B:
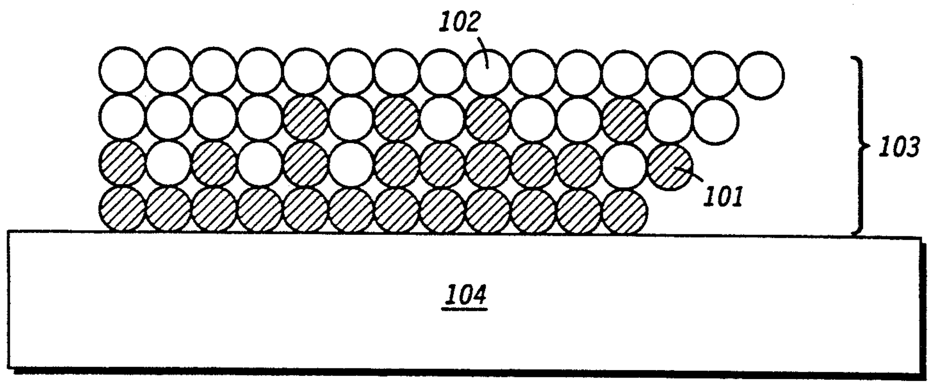

FIG. 1A further shows that the density of the elemental conductive materials (101 and 102) varies throughout the thickness of the non-homogeneous multi-elemental conductive emitter layer (103). This variation may be accomplished by selectively varying the deposition rates of each of the elemental conductive materials (101 and 102) from its corresponding material source. The elemental conductive materials (101 and 102) are selected such that a subsequent etch step (FIG. 1B) preferentially etches the second elemental conductive material (102) at a faster rate than the etch rate of the first elemental conductive material (101). (Note that prior to preferentially etching the non-homogeneous multi-elemental conductive emitter layer a film may need to be patterned such that only a portion of the non-homogeneous multi-elemental conductive emitter layer is preferentially etched. A film pattern may not be needed when the etching rates of the elemental conductive materials are sufficiently separate such that at least one of the elemental conductive materials substantially acts as a film for the other elemental conductive materials.) By selecting the material properties of the elemental conductive materials (101 and 102), a preferential geometric discontinuity of small radius of curvature (sharpening) of an edge of the non-homogeneous multi-elemental conductive emitter layer is realized.

By reducing the radius of curvature of an edge of the electron emitter layer, the total thickness of the deposited electron emitter layers may be increased. For example, the thickness may be 1000 angstroms as opposed to 500 angstroms of the prior art electron emitters. By increasing the thickness of the electron emitter layer, the electron emitter may be used in applications which require it to be partially unsupported (see FIG. 1C). In addition, the small radius of curvature provided by the preferential etch allows the magnitude of the electric field to be reduced which, in turn, allows the electron emitter to be operated at lower voltages such as 10 volts.

Figure 1C:
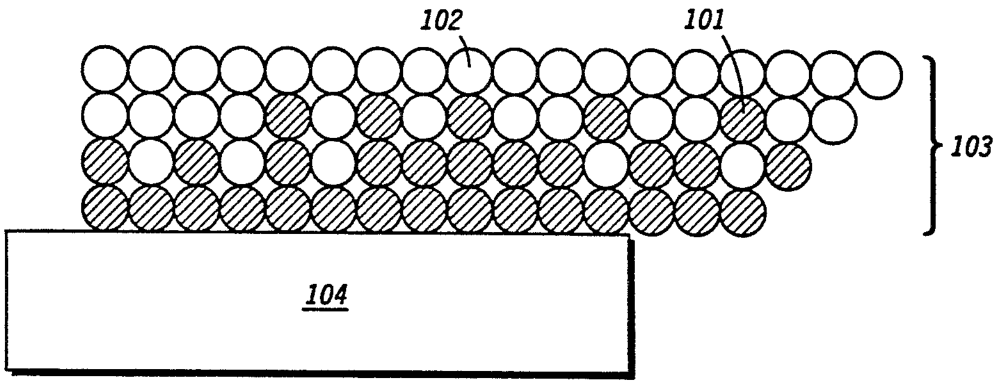

The non-homogeneous multi-elemental conductive emitter layer (103) may be partially unsupported, as shown in FIG. 1C, by performing an insulator etch step which may be performed either prior to or subsequent to the preferential etch of the non-homogeneous multi-elemental conductive emitter layer. The insulator etch step removes at least a part of the underlying supporting insulating layer (104) such that a part of the non-homogeneous multi-elemental conductive emitter layer (103) is unsupported. This subsequent insulator etch step may be desired for some applications where a concern of insulator breakdown or charging exists.

Figure 2A:
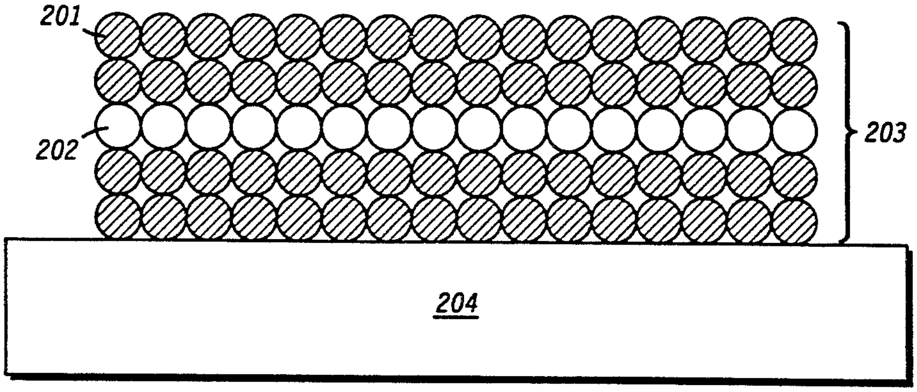
FIGS. 2A–C each illustrate a partial side elevational cross-sectional view of an electron emitter having substantially homogeneous conductive emitter layers, wherein at least two layers have different conductive materials in accordance with the present invention.

FIG. 2A shows a non-homogeneous multi-elemental conductive emitter layer (203) deposited on an insulating support layer (204). The non-homogeneous multi-elemental conductive emitter layer (203) comprises a plurality of elemental conductive materials such as metals and/or silicides. As shown in FIG. 2A, the best mode contemplates that the non-homogeneous multi-elemental conductive emitter layer (203) will comprise a first elemental conductive material (201) and a second elemental conductive material (202). As shown, the non-homogeneous multi-elemental conductive emitter layer (203) comprises a plurality of layers, wherein each layer consists of a substantially homogeneous composition of either the first or the second elemental conductive material (201 or 202). Also as shown, the second elemental conductive material (202) is sandwiched between at least two layers of the first elemental conductive material (201). Although a structure having a particular plurality of successive depositions of elemental conductive materials is shown, it should be apparent that other configurations of this sequential methodology may be employed which also achieve the desired operating features and depositing of the elemental conductive materials onto the insulating support material. One such alternative structure does not provide for a second deposition of the first elemental conductive material (201) subsequent to deposition of the second elemental conductive material (202).

Figure 2B:
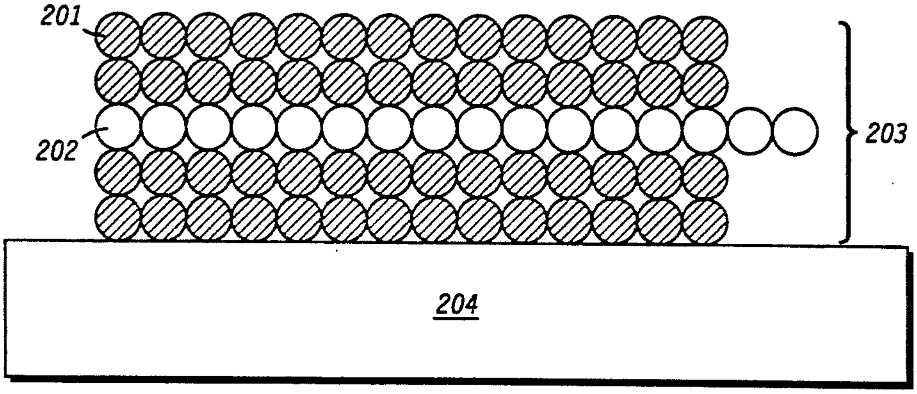
Figure 2C:
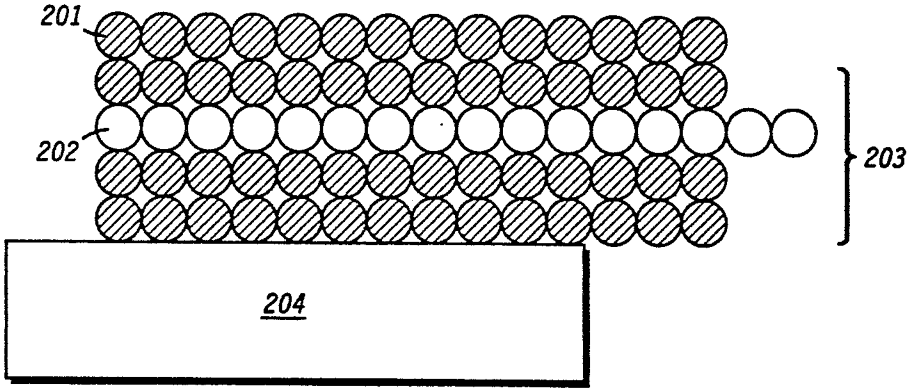

The elemental conductive materials (201 and 202) are selected such that a subsequent etch step (FIG. 2B) preferentially etches the first elemental conductive material (201) at a faster rate than the etch rate of the second elemental conductive material (202). With such a selection of the elemental conductive materials (201 and 202), a reduction in the radius of curvature (sharpening) of an edge of the non-homogeneous multi-elemental conductive emitter layer is realized. A prior or subsequent insulator etch step (FIG. 2C) may be performed to remove at least a part of the underlying supporting insulating layer so that a part of the non-homogeneous multi-elemental conductive emitter layer (20) is unsupported. This insulator etch step may be desired for some applications where a concern of insulator breakdown or charging exists.

For the embodiments of the invention described herein, by suitable selection of elemental conductive material for a desired high etch discrimination ratio and by depositing a correspondingly thin layer or successive layers of elementary constituents, an electron emitter layer with edge radius of curvature of less than 200 angstroms (typically between 50 angstroms and 200 angstroms) is realized.

What is claimed is:

1. A method of forming an electron emitter on an insulating support layer comprising the steps of:

depositing a non-homogeneous multi-elemental conductive emitter layer including a plurality of elemental conductive materials on the insulating support layer, at least some of the plurality of elemental conductive materials being etchable at dis-similar rates; and etching the plurality of elemental conductive materials of the non-homogeneous multi-elemental conductive emitter layer at dis-similar rates to form an electron emitter.

2. The method of claim 1 wherein the depositing step further comprises depositing the non-homogeneous multi-elemental conductive emitter layer by vapor deposition from a plurality of material sources wherein the deposition rate of at least some of the plurality of material sources is selectively varied to form the non-homogeneous multi-elemental conductive emitter layer.

3. The method of claim 1 wherein the depositing step further comprises depositing the non-homogeneous multi-elemental conductive emitter layer by successive deposition of a plurality of substantially homogeneous layers and wherein each of the plurality of substantially homogeneous layers comprises one of the plurality of elemental conductive materials of the non-homogeneous multi-elemental conductive emitter layer.

4. The method of claim 1 further comprising forming a preferential geometric discontinuity of small radius of curvature on the non-homogeneous multi-elemental conductive emitter layer.

5. The method of claim 4 further comprising forming a preferential geometric discontinuity of small radius of curvature such that the electron emitter layer has at least one edge with radius of curvature of less than 200 angstroms.

6. The method of claim 1 further comprising the step of etching at least a portion of the insulating support layer.

* * * * *